March 28, 1950 | M. GREEFF | 2,502,399

THERMOELECTRIC GENERATOR

Filed Sept. 23, 1947

INVENTOR.
MAX GREEFF
BY [signature]
ATTORNEY

Patented Mar. 28, 1950 2,502,399

UNITED STATES PATENT OFFICE 2,502,399

THERMOELECTRIC GENERATOR

Max Greeff, Upper Montclair, N. J., assignor to Baker & Co., Inc., Newark, N. J., a corporation of New Jersey Application September 23, 1947, Serial No. 775,710

3 Claims. (Cl. 136—4)

The present invention relates to improvements in thermoelectric generators and particularly to improvements in the efficiency of thermoelectric generators.

The conventional thermoelectric generator is a device comprising a thermocouple arrangement adapted to convert heat energy into electrical energy. It relies on the fact that when heat is applied to one junction of two wires of different metals or alloys in a thermocouple, the other junction being kept cold, an electrical current is produced.

The electromotive force of a thermocouple is directly proportional to the temperature differential between the hot and cold junctions and it is essential that a substantially high temperature differential be maintained on the one hand, and thermocouple wires having as low an electrical resistance as practical be provided on the other hand, in order to provide an efficient thermocouple.

The conventional thermoelectric generator suffers from the shortcoming that a substantial amount of heat flows from the hot junction to the cold junction of the thermocouple wire. This amount of heat energy, which is usually a substantial portion of the total generated energy, is lost for conversion into electrical energy.

It is an object of this invention to provide a thermocouple arrangement adapted to increase the efficiency of conversion of heat energy into electrical energy in a thermoelectric generator. It is another object of this invention to provide a thermocouple arrangement adapted to decrease the loss of heat conducted by thermoelectric wires. It is a further object of this invention to provide a means for concentrating the application of heat energy at the actual hot junction only, and a means for cooling the actual cold junction only. Other objects and advantages will become apparent from the embodiments of my invention particularly described in relation to the drawings forming part hereof, in which:

Figure 1:
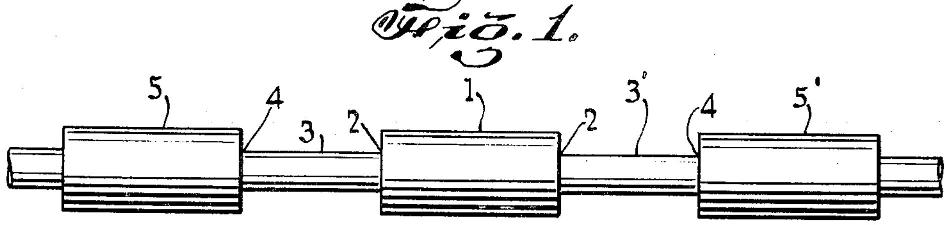
Figure 1 illustrates an elevational view of a thermocouple arrangement according to this invention.

Figure 1 shows a construction of a thermocouple arrangement whereby the heat energy applied to a heat conductor element 1, comprising fine silver, electrolytic copper, or other metals or alloys possessing good heat conductivities, is uniformly distributed throughout said heat conductor element. The heat energy applied to the heat conductor element is transmitted to the hot junctions 2 of the thermoelectric wires 3 such as Pt 10 Ir and 3′ such as 60 Au 40 Pd. The hot junctions 2 of the thermoelectric wires are secured to the heat conductor element in such manner that they do not come in direct contact with the heat producing means, i. e. a flame, hot gases, etc., which is utilized to heat the heat conductor element. This arrangement provides for the heating of the hot junctions only, and eliminates the application of heat to the thermocouple wires beyond the hot junctions. The cold junctions 4 of the thermoelectric wires 3 such as Pt 10 Ir and 3′ such as 60 Au 40 Pd are secured to the cooling elements 5 and 5′, which may be composed of the same materials as the heating element 1, and which provide for the cooling of the cold junctions only and eliminate any cooling application to the thermoelectric wires beyond the cold junctions. In this manner, I establish a control over the heating of the hot junctions and the cooling of the cold junctions. With such control established, I can decrease the conduction of heat by thermocouple wires from the hot junctions to the cold junctions to a minimum as hereinafter described. In decreasing the conduction of heat by thermocouple wires, I decrease the loss of the heat that I desire to convert efficiently from heat energy into electrical energy.

The cooling of the cold junction in a thermocouple, although such cooling is applied for the purpose of maintaining a high temperature differential between the hot junction and the cold junction, will draw heat from the hot junction through the thermocouple wire and necessitate a greater application of heat to the hot junction to maintain the hot junction at an optimum temperature. The drawing of heat from the hot junction may, of course, be greatly diminished by lengthening the thermocouple wires. However, this method increases the electrical resistance thereby neutralizing a favorable effect.

I have, therefore, provided a thermocouple construction which avoids the lengthening of the thermocouple wires and lowers the amount of heat drawn from the hot junctions. This construction is in accordance with Figure 2.

Figure 2:
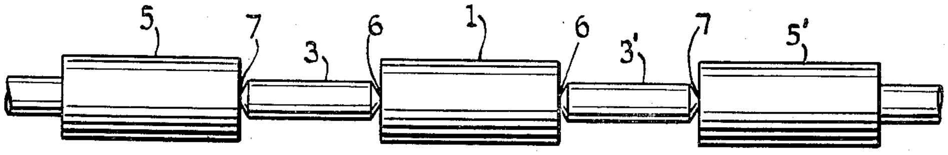
Figure 2 illustrates an elevational view of a modification of the invention.

Figure 2 illustrates a modification of the thermocouple of Figure 1 and differs therefrom only in that the hot junctions 6 are represented as reduced ends of the thermoelectric wires and cold junctions 7 are represented as reduced ends of the thermoelectric wires. It is only to such reduced ends that the conducted heat energy of the heat conductor element 1 is applied and it is only to the reduced ends representing the cold junctions that the cooling effect of the cooling elements 5 and 5′ is applied and thereby increasing the temperature differential of the thermocouple.

I have found that this construction in a thermoelectric circuit will retain an appreciable amount of the heat which would have been transferred through an unreduced wire and thus this retained heat energy can be utilized for conversion into electrical energy. Therefore, since a substantial amount of heat is retarded from entering the thermoelectric wire, it is possible to use a shorter wire and still maintain the same temperature differential as in the case of longer wires so that the thermocouple is capable of simultaneously keeping the temperature differential high and the electrical resistance low.

Figure 3:
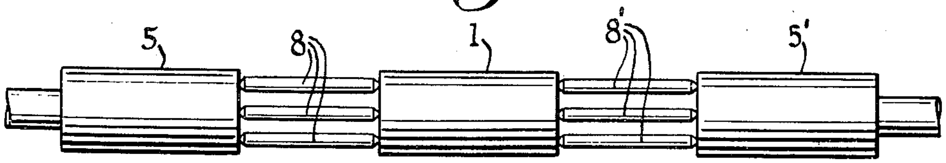
Figure 3 illustrates an elevational view of another modification of the invention.

In Figure 3, I have shown another modification of Figure 1, said modification being particularly characterized by the provision of a plurality of thermocouple wires 8 and 8′ between the heat conductor element 1 and the cooling elements 5 and 5′. Each wire of this arrangement may or may not have reduced ends such as shown in Figure 2. This construction, when compared with Figures 1 or 2, is more efficient in that it produces a greater power output even when the total cross-sectional area of the plurality of thermocouple wires of Figure 3 is equal to the cross-sectional area of the thermocouple wires of either Figures 1 or 2. The plurality of thermocouple wires, in conjunction with the thermocouple arrangement heretofore described, is particularly employed to decrease the flow of heat energy from the hot junction to the cold junction of a thermocouple without simultaneously increasing the internal electrical resistance. Therefore, the E. M. F. and power output of the thermocouple are thus increased. The internal electrical resistance is designated as the resistance between the hot and cold junctions of the thermocouple in relation to the drawings herein contained.

I have found that best results for maintaining a high E. M. F. and a low internal electrical resistance are accomplished by conforming to the thermocouple arrangement of Figure 3 and especially by choosing the dimensions of the thermocouple wires so that there is a definite relationship between the length of the wire and the cross-sectional areas of each wire. For example, in the specific materials that I choose for my thermocouple wires the length of each wire is from 8 to 12 times and preferably 10 times the square root of the cross-sectional area. This ratio may vary with the specific resistance of the materials used in thermocouple wires.

The results of tests in accordance with my invention have further demonstrated the advantages of this thermocouple arrangement.

Referring to the table below, I have entered the results of tests of three thermocouples made as nearly equal in dimensions as possible according to and representing Figures 1, 2, and 3 wherein the thermoelectric wires are one-half inch (½″) in length and 3 sq. mm. in cross-sectional area. The thermoelectric wires are composed of Pt 10 Ir (R=160 w/mil. ft.) and 60 Au 40 Pd (R=165 w/mil. ft.). The measured results are given in Columns I–V on which are based the calculated figures of Columns VI–X. The calculations are based on the assumption that the external electrical resistance is replaced by resistances equal to the internal resistances. This arrangement allows a comparison of the values of the couples under equal load conditions, each element (represented as Figures 1, 2, or 3) delivering its maximum usable power output. These power outputs are found in Column X and indicate the comparative values.

*Table*

| Fig. | I A. | II M. V. | III M. V. | IV Int. R. | V Ext. R. | VI Ef. % | VII Calc. A. | VIII Calc. V. | IX Calc. T. P. | X Calc. Util. P. |
|---|---|---|---|---|---|---|---|---|---|---|
| 1 | 0.5 | 11.0 | 12.7 | 0.0034 | 0.0220 | 87 | 1.87 | 0.0127 | 0.0228 | 0.0119 |
| 2 | 0.6 | 13.2 | 15.9 | 0.0045 | 0.0220 | 83 | 1.77 | 0.0159 | 0.0282 | 0.0141 |
| 3 | 0.57 | 12.5 | 14.5 | 0.0035 | 0.0220 | 86 | 2.07 | 0.0145 | 0.0300 | 0.0150 |

I. A.—Measured amperes.
II. M. V.—Millivolts (measured with current flowing).
III. M. V.—Millivolts (measured without current).
IV. Int. R.—Internal electrical resistance, based on I, II, III.
V. Ext. R.—External electrical resistance, based on I, II, III.
VI. Ef.—Theoretical electrical efficiency based on IV, V.
VII. Calc. A.—Calculated amperes, based on II, IV.
VIII. Calc. V.—Calculated volts, based on III.
IX. Calc. T. P.—Calculated total power, based on VII, VIII.
X. Util. P.—Power utilized externally, based on VII, VIII.

The value of the generated E. M. F. of a thermocouple is not alone indicative of the efficiency but also depends upon the internal resistance of the thermocouple and it is evident, therefore, that I have provided several adaptations in a thermocouple arrangement which keeps the E. M. F. substantially high and simultaneously keeps the internal electrical resistance low so as to provide a thermocouple which offers a greater electrical energy for various purposes than has heretofore been possible.

A thermoelectric circuit arrangement and construction in accordance with my invention and comprising thermoelectric materials having substantially high E. M. F. producing qualities permit a decrease in the length of the thermocouple wires while maintaining a substantially high temperature differential. The decrease in the length of thermocouple wires in accordance with the ratios herinbefore stated will decrease the internal electrical resistance. The application of this construction and the adaptations thereto, as herein stated, in a thermoelectric generator comprising any number of such thermocouples in series will increase the efficiency of the generator.

In all cases where thermoelectric wire is disclosed, it is to be understood that strip material, etc. may also be utilized and that the detailed description is not to be taken in a limiting sense.

What I claim is:

1. A thermocouple capable of maintaining a substantially high E. M. F. and a low internal electrical resistance in the conversion of heat energy into electrical energy, comprising in combination a good heat conductor element positioned between hot junctions of thermoelectric wires, cooling elements positioned at the cold junctions of thermoelectric wires, said thermoelectric wires being of smaller diameter than said heat conductor element and said cooling elements at the hot and cold junctions and along the length of the wires and each thermoelectric wire having a length equal to from 8 to 12 times the square root of its cross-sectional area and said thermoelectric wires having reduced ends at the hot and cold junctions.

2. A thermocouple capable of maintaining a substantially high E. M. F. and a low internal electrical resistance in the conversion of heat energy into electrical energy, comprising in combination a heat conductor element of fine silver positioned between the hot junctions of thermoelectric wires, cooling elements of fine silver positioned at the cold junctions of thermoelectric wires, a plurality of said thermoelectric wires, positioned between the heat conductor element and each cooling element, each thermoelectric wire of said plurality of thermocouple wires having a length equal to from 8 to 12 times the square root of its cross-sectional area.

3. A thermocouple according to claim 2 comprising a plurality of thermoelectric wires positioned between a heat conductor element and a cooling element, each thermoelectric wire of said plurality of wires having reduced ends at the hot and cold junctions in contact with said heating and cooling elements only at said reduced ends to retard the flow of heat from the hot junctions to the cold junctions of said thermocouple.

MAX GREEFF.

REFERENCES CITED

The following references are of record in the file of this patent:

UNITED STATES PATENTS

| Number | Name | Date |
|---|---|---|
| 650,062 | Gottscho | May 22, 1900 |
| 715,265 | Heil | Dec. 9, 1902 |
| 764,175 | Bristol | July 5, 1904 |
| 906,991 | Babcock | Dec. 15, 1908 |
| 1,638,894 | Todd | Aug. 16, 1927 |
| 2,215,332 | Milnes | Sept. 17, 1940 |
| 2,232,961 | Milnes | Feb. 25, 1941 |
| 2,327,945 | Wallin | Aug. 24, 1943 |

FOREIGN PATENTS

| Number | Country | Date |
|---|---|---|
| 772,017 | France | Aug. 6, 1934 |

OTHER REFERENCES

Coblentz, W. W., Bull. Bur. Stds., vol. 4 (1908), page 399.